(12) United States Patent
Tanaka et al.

(10) Patent No.: US 9,954,072 B2
(45) Date of Patent: Apr. 24, 2018

(54) SILICON-CARBIDE SEMICONDUCTOR DEVICE AND MANUFACTURING METHOD THEREOF

(71) Applicant: Mitsubishi Electric Corporation, Tokyo (JP)

(72) Inventors: Rina Tanaka, Tokyo (JP); Yasuhiro Kagawa, Tokyo (JP); Shiro Hino, Tokyo (JP); Naruhisa Miura, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 177 days.

(21) Appl. No.: 14/428,840

(22) PCT Filed: Sep. 5, 2013

(86) PCT No.: PCT/JP2013/073977
§ 371 (c)(1),
(2) Date: Mar. 17, 2015

(87) PCT Pub. No.: WO2014/061367
PCT Pub. Date: Apr. 24, 2014

(65) Prior Publication Data
US 2015/0236119 A1   Aug. 20, 2015

(30) Foreign Application Priority Data
Oct. 18, 2012   (JP) .................................. 2012-231050

(51) Int. Cl.
*H01L 21/336*   (2006.01)
*H01L 29/66*   (2006.01)
(Continued)

(52) U.S. Cl.
CPC .... *H01L 29/66068* (2013.01); *H01L 29/1095* (2013.01); *H01L 29/1608* (2013.01); *H01L 29/7813* (2013.01)

(58) Field of Classification Search
CPC ........... H01L 29/66068; H01L 29/1095; H01L 29/1608; H01L 29/7813; H01L 257/77;
(Continued)

(56) References Cited

U.S. PATENT DOCUMENTS 6,084,264 A    7/2000  Darwish
7,833,863 B1   11/2010 Pattanayak et al.
(Continued)

FOREIGN PATENT DOCUMENTS

JP    11 354788       12/1999
JP    2000 164869     6/2000
(Continued)

OTHER PUBLICATIONS

International Search Report issued Oct. 8, 2013 in PCT/JP13/073977 filed Sep. 5, 2013.

*Primary Examiner* — Julio J Maldonado
*Assistant Examiner* — Stanetta Isaac
(74) *Attorney, Agent, or Firm* — Oblon, McClelland, Maier & Neustadt, L.L.P.

(57) ABSTRACT

A silicon-carbide semiconductor device that relaxes field intensity in a gate insulating film, and that has a low ON-resistance. The silicon-carbide semiconductor device includes: an n-type silicon-carbide substrate; a drift layer formed on a topside of the n-type silicon-carbide substrate; a trench formed in the drift layer and that includes therein a gate insulating film and a gate electrode; a p-type high-concentration well region formed parallel to the trench with a spacing therefrom and that has a depth larger than that of the trench; and a p-type body region formed to have a depth
(Continued)

that gradually increases when nearing from a position upward from the bottom end of the trench by approximately the thickness of the gate insulating film at the bottom of the trench toward the lower end of the p-type high-concentration well region.

12 Claims, 10 Drawing Sheets

(51) Int. Cl.
  *H01L 29/78* (2006.01)
  *H01L 29/16* (2006.01)
  *H01L 29/10* (2006.01)

(58) Field of Classification Search
  CPC ......... H01L 21/02378; H01L 21/02529; H01L 29/1602; H01L 21/02376; H01L 21/02527; H01L 33/34; H01L 21/0237
  See application file for complete search history.

(56) References Cited

U.S. PATENT DOCUMENTS

| | | | |
|---|---|---|---|
| 8,653,593 | B2 | 2/2014 | Omori |
| 2007/0141783 | A1 | 6/2007 | Peake |
| 2009/0032821 | A1* | 2/2009 | Onose .................. H01L 25/18 257/77 |
| 2009/0114969 | A1 | 5/2009 | Suzuki et al. |
| 2009/0200559 | A1 | 8/2009 | Suzuki et al. |
| 2009/0302379 | A1 | 12/2009 | Takaishi |
| 2010/0078714 | A1 | 4/2010 | Tu et al. |
| 2011/0303925 | A1* | 12/2011 | Nishimura .......... H01L 29/0878 257/77 |
| 2013/0049105 | A1* | 2/2013 | Omori .............. H01L 29/41766 257/330 |
| 2013/0306983 | A1 | 11/2013 | Nakano et al. |

FOREIGN PATENT DOCUMENTS

| | | |
|---|---|---|
| JP | 2001 508595 | 6/2001 |
| JP | 2001 284588 | 10/2001 |
| JP | 2002 190595 | 7/2002 |
| JP | 2007 059632 | 3/2007 |
| JP | 2007 110047 | 4/2007 |
| JP | 2007 513523 | 5/2007 |
| JP | 2009 117593 | 5/2009 |
| JP | 2013 084899 | 5/2013 |
| WO | 2005 088695 | 9/2005 |
| WO | 2006 134810 | 12/2006 |
| WO | 2012 105613 | 8/2012 |

* cited by examiner

US 9,954,072 B2

SILICON-CARBIDE SEMICONDUCTOR DEVICE AND MANUFACTURING METHOD THEREOF

FIELD

The present invention relates to a silicon-carbide semiconductor device and a manufacturing method thereof, and more particularly to a trench-gate silicon-carbide semiconductor device.

BACKGROUND

A silicon-carbide semiconductor device has been used as a high-withstanding voltage, low-loss semiconductor device capable of switching at a high speed. Particularly, a trench-gate silicon-carbide semiconductor device has a higher channel density per unit area, and thus it has a greater current amount, as compared to a general planar silicon-carbide semiconductor device. A reduction in the ON-resistance is expected in such a trench-gate silicon-carbide semiconductor device.

In the trench-gate silicon-carbide semiconductor device in general, an epitaxial layer of a low-defect-density n-type semiconductor is formed on an n-type semiconductor substrate, and a p-type semiconductor layer is formed in addition. An n-type high-concentration layer (an $n^+$ layer) connected to a source electrode and a p-type high-concentration layer (a $p^+$ layer) connected to the p-type semiconductor layer described above are formed on the surface. A trench is formed so as to penetrate through the p-type semiconductor layer.

In the trench-gate silicon-carbide semiconductor device, a gate insulating film and a gate-electrode material are embedded within the trench to form a gate electrode. Generally, the trench is formed in an elongated shape. Therefore, the high density of the gate electrode can be obtained, as compared to the planar silicon-carbide semiconductor device where a flat gate electrode is formed on the surface of the semiconductor device. Such a high density of the gate electrode can increase the channel density per unit area, and thus a reduction in ON-resistance can be achieved. However, the trench is formed deeply, so that the distance between a drain electrode on the back side of the silicon-carbide semiconductor device and the gate electrode within the trench may be set to be small. Such a short distance may cause high electric field intensity between them. In such a case, a dielectric breakdown may occur. Therefore, it is difficult to simultaneously achieve high efficiency and a high withstanding voltage by reducing the ON-resistance.

A structure for improving the withstanding voltage for this problem is proposed in a technique in which a p-type well region is formed at a location apart from the trench so as to have a depth that is equal to or greater than that of the trench (Patent Literature 1). A depletion layer extends from a junction between this deep p-type well region and an n-type drift layer just below the p-type well region, so that the bottom of the trench is protected. This can reduce the electric field intensity between the gate insulating film and the drain electrode on the back side of the silicon-carbide semiconductor device, and thus the withstanding voltage can be increased.

CITATION LIST

Patent Literature

Patent Literature 1: Japanese Patent Application Laid-open No. 2009-117593

SUMMARY

Technical Problem

As described in Patent Literature 1, the depletion layer is formed at the bottom of the trench, so that the electric field intensity can be decreased in the gate insulating film. However, the electric field is most concentrated at a corner portion of the lower end of the trench, leading to a high electric field at the corner portion. The corner portion of the lower end of the trench is exposed to the drift layer, and thus the lower end of the trench cannot be protected sufficiently by the depletion layer in some cases. Accordingly, the electric field intensity cannot be sufficiently reduced, and thus the withstanding voltage cannot be greatly improved. In a case where the p-type well region is provided closer to the trench, the depletion layer reaches the lower end of the trench more easily. In this case, the electric field intensity applied to the gate insulating film can be relaxed, and thus the withstanding voltage can be increased. However, in this case, a current path is narrowed when the semiconductor device is ON, causing an increase in the resistance. Therefore, high efficiency cannot be achieved. That is, the silicon-carbide semiconductor device has a problem that it is difficult to obtain high efficiency when this semiconductor device is ON together with a high withstanding voltage when this semiconductor device is OFF.

The present invention has been achieved to solve the above problems. It aims to provide a highly-efficient silicon-carbide semiconductor device that achieves a high withstanding voltage by relaxing electric field concentration between a drain electrode and a gate insulating film within a trench, and that achieves a reduction in ON-resistance.

Solution to Problem

To solve the above problems and achieve the object, the present invention provides a silicon-carbide semiconductor device that includes a silicon-carbide semiconductor substrate of a first conductivity-type; a drift layer formed on a first surface of the silicon-carbide semiconductor substrate of the first conductivity-type; a trench formed in the drift layer; a gate electrode formed within the trench from a gate insulating film; a high-concentration well region of a second conductivity-type formed with a spacing from the trench, the high-concentration well region having a depth greater than that of the trench; and a body region of the second conductivity-type formed to have a depth that increases as it approaches, from a position upward from the bottom of the trench, the bottom of the high-concentration well region of the second conductivity-type.

Advantageous Effects of Invention

In a silicon-carbide semiconductor device of the present invention, a body region of a second conductivity-type is formed to have a depth that is increased from a position upward from an end of a gate electrode, located at a bottom end of a trench, toward a bottom of a high-concentration well region of a p-type. In other words, the silicon-carbide semiconductor device has a structure in which the trench is embedded into the body region of the second conductivity-type. Therefore, when the silicon-carbide semiconductor device is OFF, a depletion layer extends from a junction portion between the drift layer and the body region; and accordingly concentration of electric field can be relaxed at the bottom end of the trench. Further, the high-concentration well region of the second conductivity-type is formed so as to have a depth greater than that of the trench. An electric field from a drain electrode is attracted by the high-concentration well region, and thus the withstanding voltage can be increased. When the silicon-carbide semiconductor device is ON, there is not a depletion layer just below the trench and a current path beside the trench is not interfered by the body region, and thus a channel is formed. Accordingly, the ON-resistance of the silicon-carbide semiconductor device is low, and consequently high efficiency can be achieved. Therefore, high efficiency when the silicon-carbide semiconductor device is ON can be achieved together with a high withstanding voltage when the silicon-carbide semiconductor device is OFF.

BRIEF DESCRIPTION OF DRAWINGS

FIG. 2(a) is a cross-sectional view taken along a line A-A in FIG. 1 and FIG. 2(b) is an enlarged view of a portion in FIG. 2(a).

DESCRIPTION OF EMBODIMENTS

Figure 1:
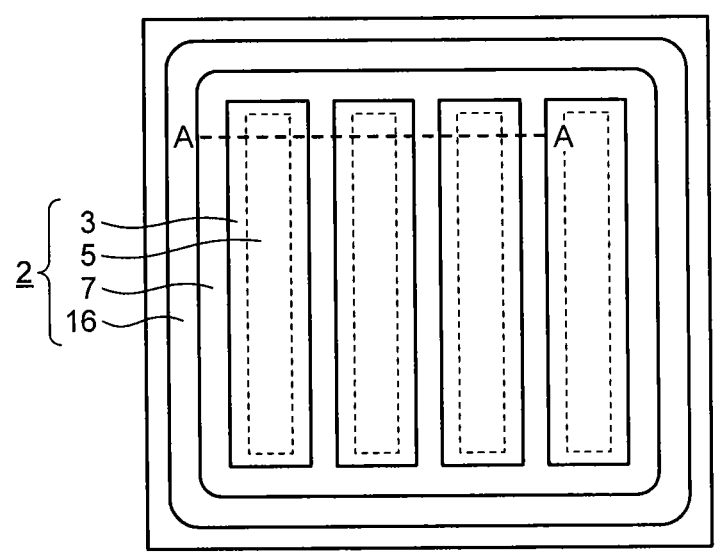
FIG. 1 is a top view of a silicon-carbide semiconductor device according to a first embodiment of the present invention.

Exemplary embodiments of a silicon-carbide semiconductor device according to the present invention will be described below in detail with reference to the accompanying drawings. The present invention is not limited to the following descriptions and can be appropriately modified without departing from the scope of the present invention. Note that, in the drawings illustrated below, scale sizes of respective elements may be illustrated differently from actual products for the sake of facilitating understanding. Elements denoted by like reference numerals correspond to the same or equivalent elements in the descriptions of the embodiments and the drawings. In addition, the notation of "high-concentration" or "low-concentration" for structural parts of the silicon-carbide semiconductor device indicates that the ion-implantation concentration is high or low. However, this notation does not indicate that the absolute concentration is high or low, but indicates that the concentration is relatively high or low as compared to a neighboring region with the same polarity.

First Embodiment

<Structure of Silicon-Carbide Semiconductor Device>

Figure 2:
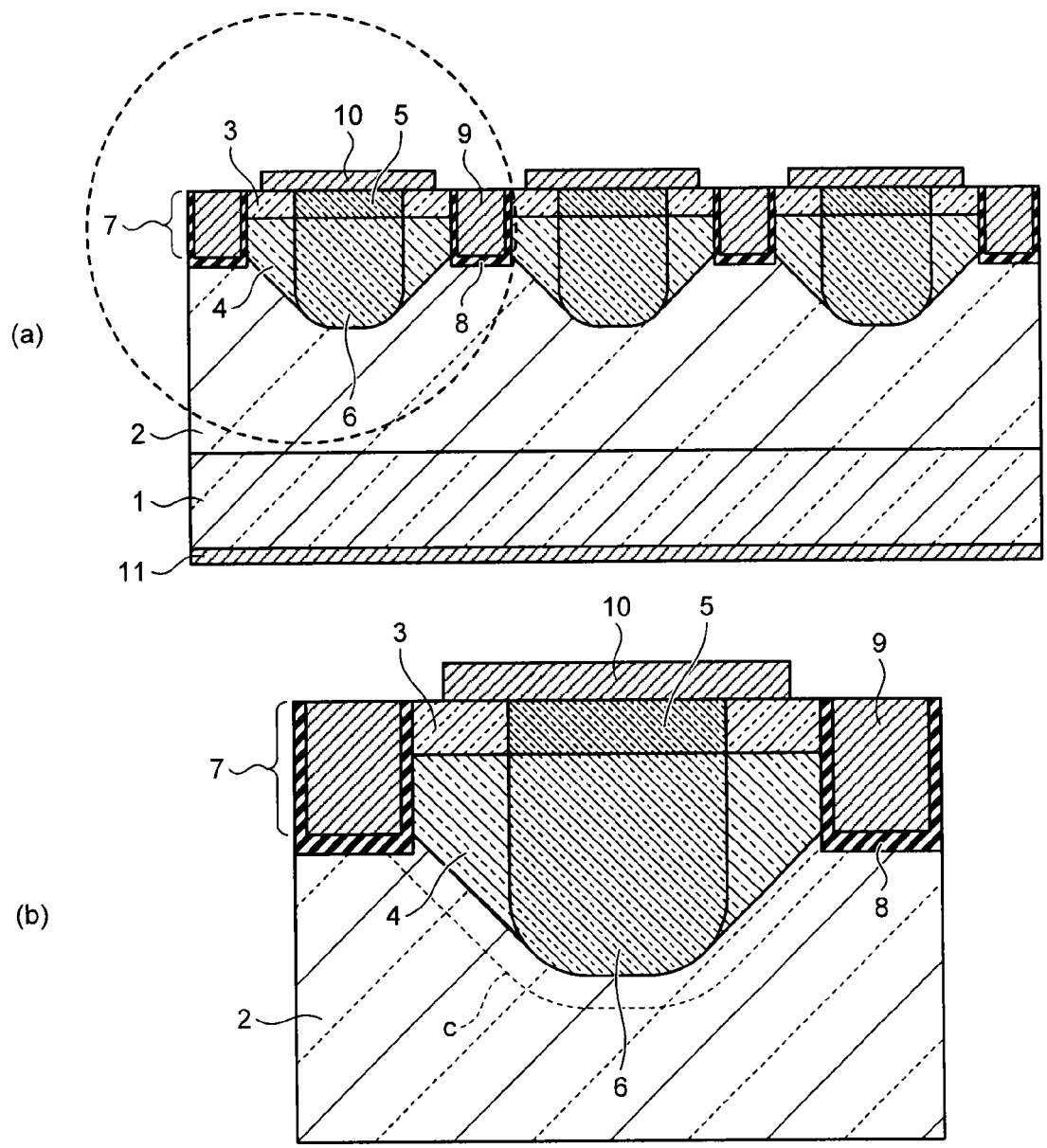
FIGS. 2(a) and 2(b) are cross-sectional views of the silicon-carbide semiconductor device according to the first embodiment of the present invention, where

FIG. 1 is a top view of a silicon-carbide semiconductor device according to a first embodiment of the present invention, and illustrates a state without a source electrode 10 for ease of viewing the surface structure of the silicon-carbide semiconductor device. FIG. 2 are cross-sectional views of the silicon-carbide semiconductor device according to the first embodiment (including the source electrode 10). FIG. 2(a) illustrates an enlarged cross section taken along a line A-A in FIG. 1. FIG. 2(b) illustrates an enlarged cross section of a portion circled by the dotted line in FIG. 2(a).

As illustrated in FIG. 2(a), in the silicon-carbide semiconductor device, a drift layer 2 of n-type silicon carbide is formed on the topside of an n-type silicon-carbide substrate 1, and a drain electrode 11 is formed on the underside of the n-type silicon-carbide substrate 1. As illustrated in FIG. 1, on the topside of the silicon-carbide semiconductor device, a termination region 16 of p-type silicon carbide is formed around the periphery of the silicon-carbide semiconductor device. On the inner side of the termination region 16, a trench 7 is formed so that it has a stripe shape extending in a vertical direction and has the top-end portion and the bottom-end portion extending in a horizontal direction.

As illustrated in FIG. 2(a), in a middle portion between the trench 7 and its adjacent trench 7, a p-type body region 4 is formed to surround a p-type high-concentration well region 6. An n-type source region 3 is formed on the top of the p-type body region 4 at the interface of the source electrode 10, and a p-type well contact region 5 is formed on the top of the p-type high-concentration well region 6. On the inner wall surface of the trench 7, a gate insulating film 8 is formed. Within the gate insulating film 8, a gate electrode 9 is formed. Each of the semiconductor regions is implanted by ion implantation of different ion species and has different impurity concentrations from each other. A specific manufacturing method, a specific impurity concentration, and the like are described later.

As illustrated by the enlarged cross section in FIG. 2(b), the p-type high-concentration well region 6 is formed so as to have a depth greater than that of the trench 7. The p-type body region 4 is formed to have a depth which is increased from the vicinity of the bottom of the trench 7, desirably from the lower end of the gate electrode 9, toward the lower portion of the p-type high-concentration well region 6. The vicinity of the bottom of the trench 7 means the lower end of the gate electrode 9 as an optimal position. It is desirable that the vicinity of the bottom of the trench 7 is near a position upward from the bottom end of the trench 7, preferably, by a distance corresponding to the thickness of the gate insulating film 8 at the bottom of the trench 7. The boundary between the p-type body region 4 and the drift layer 2 is formed to be slanted with respect to the surface of the drift layer 2. It is desirable that an obtuse angle is formed by the bottom of the trench 7 and the p-type body region 4 on both sides of the trench 7. The boundary between the p-type body region 4 and the drift layer 2 is slanted with respect to the surface of the drift layer 2 such that an obtuse angle is formed by the bottom of the trench 7 and the p-type body region 4 on both sides of the trench 7. Therefore, a depletion layer "c" extends so as to cover an edge of the bottom of the trench 7. Accordingly, even in a case where the lower end (the bottom end) of the p-type body region 4 is shifted slightly in a direction in which the trench edge is exposed, the depletion layer "c" still extends around the lower end of the p-type body region 4, and thus the edge of the bottom of the trench 7 is sufficiently covered by the depletion layer "c". This can relax the electric field, and improves the withstanding voltage. In a case of an acute angle formed by the bottom of the trench 7 and the p-type body region 4 on both sides of the trench 7, the trench 7 is formed to be embedded deeply into the p-type body region 4. In this case, the trench 7 is entirely covered with the depletion layer "c" generated along a junction between the p-type body region 4 and the drift layer 2, and thus the ON-resistance of the semiconductor device may increase.

As described above, the p-type body region 4 has most preferable characteristics in a case where it is formed to start from the lower end of the gate electrode 9, that is, near a position upward from the bottom end of the trench 7 by a distance corresponding to the thickness of the gate insulating film 8 at the bottom of the trench 7, and to become deeper toward the bottom of the p-type high-concentration well region 6. The position upward from the bottom end of the trench 7 by a distance corresponding to the thickness of the gate insulating film 8 at the bottom of the trench 7 does not always indicate only the position upward from the lower end of the trench 7 by a distance that exactly corresponds to the thickness of the gate insulating film 8 at the bottom of the trench 7, but indicates a position that can vary depending on variations in device accuracy of processes and variations due to an unclear interface formed at an ion implantation step.

The range of the p-type body region 4 is defined as a range where the impurity concentration resulting from ion implantation varies by ±50% relative to a target value. In this case, the boundary of the p-type body region 4 varies by approximately ±35 nanometers due to the impurity-concentration distribution resulting from the ion implantation. Therefore, when the device accuracy and other factors at the ion implantation step are considered, the position upward from the bottom end of the trench 7 by a distance corresponding to the thickness of the gate insulating film 8 at the bottom of the trench 7 indicates the range between ±50 nanometers relative to the thickness of the gate insulating film 8 at the bottom of the trench 7.

For example, in a case where the p-type body region 4 is formed from the bottom end of the trench 7, the gate electrode 9 is in a state where it is embedded into the p-type body region 4 by a distance corresponding to the thickness of the gate insulating film 8. When a voltage is applied to the p-type body region 4 from the gate electrode 9 within the trench 7, a channel is formed in the p-type body region 4 in the vicinity of the trench 7, and the semiconductor device is brought into an ON-state. However, the p-type body region 4 near the bottom end of the trench 7 is formed deeper than the gate electrode 9, a channel is not easily formed, and therefore a current path is interfered with. As a result, the silicon-carbide semiconductor device may have a slightly higher ON-resistance.

In a case where the p-type body region 4 is formed from a position upward from the bottom end of the trench 7 by a distance that exactly corresponds with the thickness of the gate insulating film 8 at the bottom of the trench 7, the gate electrode 9 within the trench 7 has the same depth as the p-type body region 4. When a voltage is applied from the gate electrode 9 within the trench 7 to the p-type body region 4, a channel is formed in the p-type body region 4 in its entirety, and therefore a current path is ensured. As a result, the silicon-carbide semiconductor device has very low ON-resistance. The gate insulating film 8 is protected by the depletion layer "c" generated along a junction between the p-type body region 4 and the drift layer 2. This can relax the electric field, and therefore the withstanding voltage of the silicon-carbide semiconductor device can be increased.

In a case where the p-type body region 4 is formed from a position upward from the bottom end of the trench 7 by a distance of +50 nanometers or greater relative to the thickness of the gate insulating film 8 at the bottom of the trench 7, the gate electrode 9 is in a state where its lower end protrudes to the bottom of the p-type body region 4. Therefore, a channel is formed in the p-type body region 4, and accordingly the silicon-carbide semiconductor device has a lower the ON-resistance. Meanwhile, because the gate electrode 9 is formed deeper, the electric field in the drain electrode 11 is more likely to be applied to the gate electrode 9, and therefore the withstanding voltage becomes slightly lower.

In contrast, in a case where the p-type body region 4 is formed from a position upward from the bottom end of the trench 7 by a distance of −50 nanometers or less relative to the thickness of the gate insulating film 8 at the bottom of the trench 7, the withstanding voltage becomes higher. However, a region is generated where a gate voltage is hardly applied and a channel is hardly formed. Therefore, the ON-resistance of the silicon-carbide semiconductor device becomes slightly higher.

That is, it is preferable to form the p-type body region 4 from a position upward from the bottom end of the trench 7 by a distance within ±50 nanometers relative to the thickness of the gate insulating film 8 at the bottom of the trench 7. This is because, to be exact, although the characteristics configured as above are slightly degraded if compared to the case where the p-type body region 4 is formed from a position upward from the bottom end of the trench 7 by a distance that exactly corresponds with the thickness of the gate insulating film 8 at the bottom of the trench 7; a semiconductor device with the ON-resistance being lower and the withstanding voltage being higher as compared to conventional silicon-carbide can be obtained, of which characteristics are superior to the known technique.

For the reasons described above, it is necessary that the p-type body region 4 is formed from the lower end of the gate electrode 9, that is, from a position upward from the bottom end of the trench 7 by a distance corresponding to the thickness of the gate insulating film 8 at the bottom of the trench 7. However, as described above, the position upward from the bottom end of the trench 7 by a distance corresponding to the thickness of the gate insulating film 8 at the bottom of the trench 7 is a position that varies depending on variations in device accuracy, in ion-density distribution, and in other factors. When the variations of the position is assumed to fall within the range between ±50 nanometers relative to the thickness of the gate insulating film 8, the silicon-carbide semiconductor device has improved characteristics as compared to conventional semiconductor devices.

<Manufacturing Method of Silicon-Carbide Semiconductor Device>

FIGS. 3(a) to 3(d) illustrate manufacturing steps of the silicon-carbide semiconductor device according to the present embodiment. The order of the manufacturing steps can be interchanged unless otherwise specified. The manufacturing steps are described herein by focusing on a manufacturing method of the p-type body region 4 that is a feature of the present invention.

Figure 3:
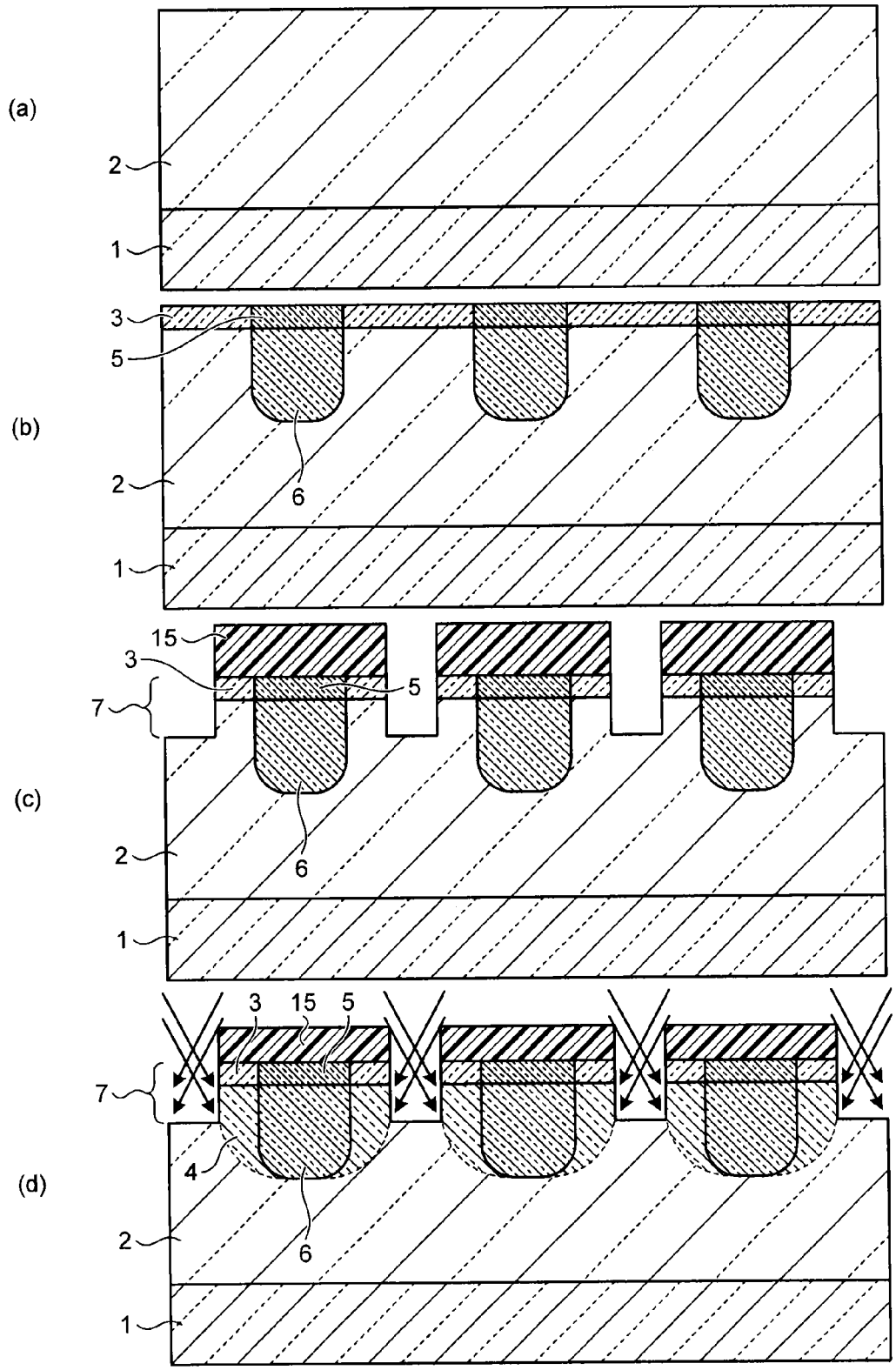
FIGS. 3(a) to 3(d) are process cross-sectional views of a manufacturing method of the silicon-carbide semiconductor device according to the first embodiment of the present invention.

As illustrated in FIG. 3(a), an n-type silicon-carbide layer serving as the drift layer 2 is formed on the n-type silicon-carbide substrate 1 using an epitaxial growth method.

As illustrated in FIG. 3(b), on the surface of the drift layer 2, the n-type source region 3, the p-type well contact region 5, and the p-type high-concentration well region 6 are formed by ion implantations. At these ion implantation steps, the n-type source region 3 can be formed using donor impurities with a concentration of approximately $1 \times 10^{19}/cm^3$, the p-type well contact region 5 can be formed using acceptor impurities with a concentration of approximately $1 \times 10^{20}/cm^3$, and the p-type high-concentration well region 6 can be formed using acceptor impurities with a concentration of approximately $1 \times 10^{18}/cm^3$, for example.

In the present embodiment, nitrogen is used for the donor impurities and aluminum is employed for the acceptor impurities, these impurities are not limited thereto. Phosphorus or other elements can be used for the donor impurities, and boron or other elements can be used for the acceptor impurities, in the same manner as described above. The ion-implantation concentration is not particularly limited. Various ion-implantation concentrations can be used in accordance with the characteristics of adjacent semiconductor layers.

As illustrated in FIG. 3(c), at a central portion of the n-type source region 3, masks 15, which are made of a material such as a silicon oxide film and separated by slit gaps, are formed to provide the trench 7. The trench 7 is formed by dry etching using a mixed gas of carbon tetra-fluoride ($CF_4$), oxygen ($O_2$), and argon (Ar). This trench 7 is formed so as to have a depth smaller than that of the p-type high-concentration well region 6.

As illustrated in FIG. 3(d), oblique ion implantation is performed from the interior of the trench 7 to form the p-type body region 4. The p-type body region 4 is formed so as to have a depth which is increased, when nearing, from the bottom of the trench 7 toward the bottom of the p-type high-concentration well region 6. There is a problem that the drift layer 2 is changed to a p-type semiconductor when acceptor-impurity ions are implanted into the drift layer 2 on the bottom surface of the trench 7. A flow of electrons near the bottom surface of the trench 7 may be interfered with, and thus the ON-resistance of the semiconductor device becomes higher. Consequently, caution is necessary as to the oblique ion implantation, such as adjusting the implantation angle so that ions is implanted into the bottom surface of the trench 7.

When oblique ion implantation is performed in a direction from the interior of the trench 7 to the side of the trench 7 at a desired angle, the p-type body region 4 in the vicinity of the trench 7 can have the almost same depth as the trench 7. This is advantageous for obtaining a structure that achieves a high withstanding voltage and high efficiency, which is described later.

At the ion implantation step from the interior of this trench 7, the p-type body region 4 is formed from the position upward from the bottom of the trench 7 to become deeper toward the bottom of the p-type high-concentration well region 6. Subsequently, the gate insulating film 8 is formed on the inner wall portion of the trench 7. When the gate electrode 9 is formed within the gate insulating film 8, the bottom end of the gate electrode 9 has almost same depth as the bottom end of the p-type body region 4 adjacent to the bottom end of the gate electrode 9.

When a voltage is applied to the gate electrode 9, and the semiconductor device is brought into an ON-state, the p-type body region 4 forms a channel in the vicinity of the trench 7, leading to electrically conductive state. When the semiconductor device is brought into an OFF-state, the depletion layer "c" formed between the drift layer 2 and the p-type body region 4 around the gate insulating film 8 can relax the field intensity in the gate insulating film 8. Therefore, the semiconductor device can have a high withstanding voltage.

In the case of forming the p-type body region 4 from a position upward from the bottom end of the trench 7 by a distance corresponding to the thickness of the gate insulating film 8 at the bottom of the trench 7, the p-type body region 4 is supposed to be formed from a position upward from the bottom end of the trench 7 by a distance within ±50 nanometers relative to the thickness of the gate insulating film 8 at the bottom of the trench 7, when taking into consideration the accuracy of a manufacturing device and an impurity distribution during the ion implantation as described above.

At this time, as compared to the case where the p-type body region 4 is formed from a position exactly corresponding to the thickness of the gate insulating film 8, the characteristics of the semiconductor device are slightly degraded. However, the silicon-carbide semiconductor device abstained as above has sufficiently improved characteristics in comparison with other semiconductor devices. Further, assuming that the p-type body region 4 can be formed from a position upward from the bottom end of the trench 7 by a distance within ±20 nanometers relative to the thickness of the gate insulating film 8 at the bottom of the trench 7, the silicon-carbide semiconductor device having further superior characteristics can be obtained.

According to the above steps, the area of the trench 7, which is exposed to the drift layer 2, can be decreased; and the depletion layer "c", generated along a junction portion between the drift layer 2 and the p-type body region 4 in the vicinity of the trench 7, can further extend. This can reduce the field intensity in the gate insulating film 8 within the trench 7.

In the oblique ion implantation from the interior of this trench 7, an embedding material different from the mask 15 may be embedded within the trench 7; and ions may also be implanted through this embedded material. When ion implantation is performed through the embedded material, ions are implanted into the embedded material at the bottom-surface portion of the trench 7. This provides a feature that ions are hardly implanted into the bottom surface of the trench 7. As the embedded material, any ion absorber may be used. A resin material such as a resist or other inorganic materials, which are different from a silicon oxide film constituting the mask 15, may be used.

When ion implantation is performed through this embedded material, it is also very preferable to form the p-type body region 4 such that a portion of the trench 7 upward from its bottom makes contact with the p-type body region 4. The p-type body region 4 can also be formed from a position upward from the bottom end of the trench 7 by a distance within ±50 nanometers relative to the thickness of the gate insulating film 8 at the bottom of the trench 7, and further preferably, by a distance within ±20 nanometers relative to the thickness of the gate insulating film 8.

Either in the case where oblique ion implantation is performed from the interior of the trench 7, or in the case where oblique ion implantation is performed through materials that are embedded into the trench 7, the acceptor impurity concentration is not particularly limited. However, the acceptor impurity concentration is preferably from $1\times10^{16}/cm^3$ to $1\times10^{18}/cm^3$. When the acceptor impurity concentration is below $1\times10^{16}/cm^3$, it is insufficient to form the p-type body region 4. When the acceptor impurity concentration is over $1\times10^{18}/cm^3$, the peripheral portion may be significantly affected, which does not give desired characteristics of the semiconductor device.

Thereafter, the mask 15 and the embedded material when used are removed and the gate insulating film 8 and the gate electrode 9 are formed within the trench 7. The removing can be performed by including dissolving. Note that it is necessary that an obtuse angle is formed between the bottom surface of the trench 7 and both lower sides of the p-type body region 4, the p-type body region 4 being formed such that its depth becomes deeper as it approaches, from the bottom of the trench 7, the bottom of the p-type high-concentration well region 6. Finally, the source electrode 10 is formed such that it makes contact with the n-type source region 3 and the p-type well contact region 5; and the drain electrode 11 is formed on the back side. Thus, the silicon-carbide semiconductor device illustrated in FIGS. 1 and 2 can be obtained.

Figure 4:
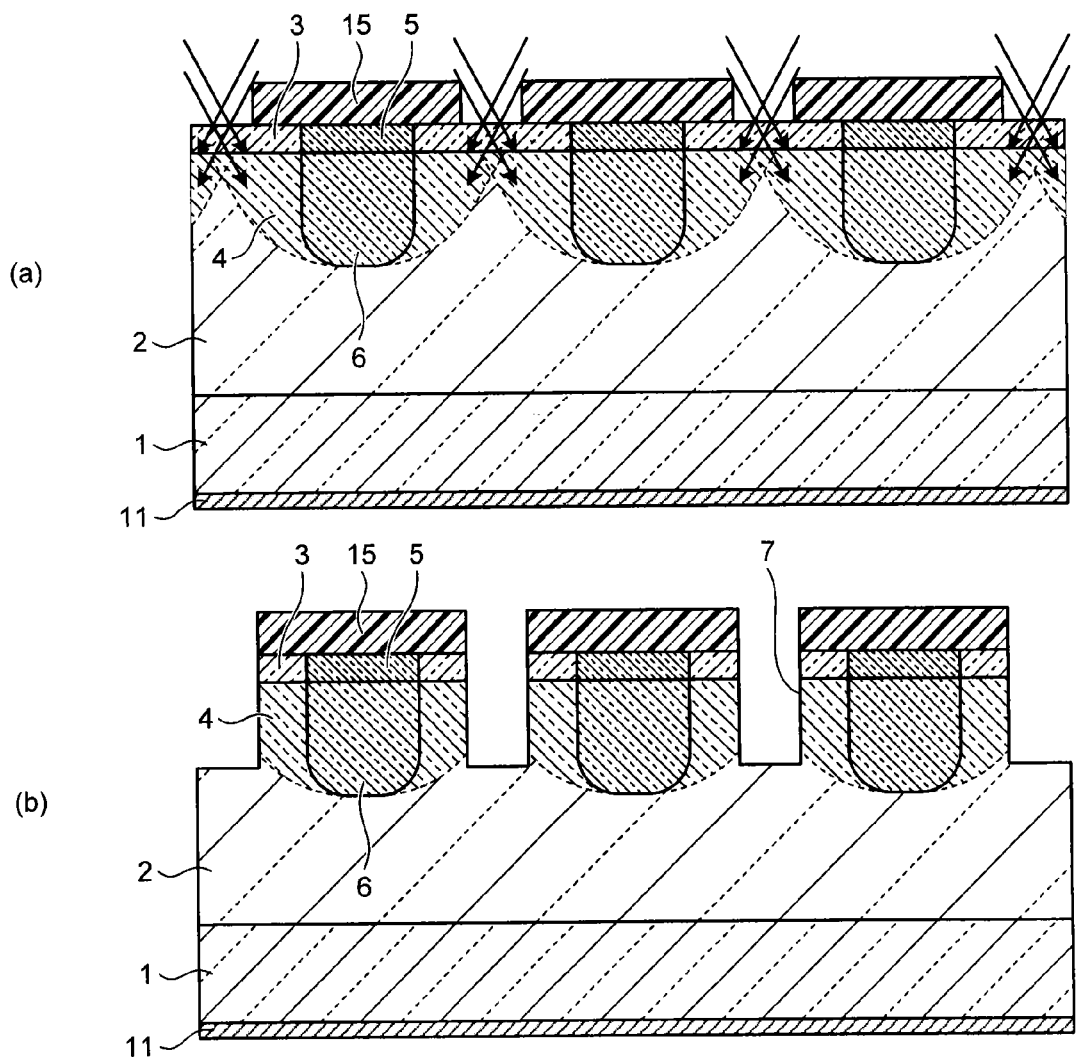
FIGS. 4(a) and 4(b) are cross-sectional views of the manufacturing method of the silicon-carbide semiconductor device according to the first embodiment of the present invention.

In the present embodiment, at the steps of forming a silicon-carbide semiconductor device, the etching is performed with the mask 15 so as to form the trench 7. Then, the p-type body region 4 is formed by an oblique ion implantation step from the interior of the trench 7 or by an oblique ion implantation step through the embedded material by which the embedded trench 7 is embedded. However, the trench 7 may be formed after oblique ion implantation as illustrated in a modification below. That is, as illustrated in FIG. 4(*a*), prior to forming the trench 7, the p-type body region 4 is formed by using an opening of the mask 15 as a mask for oblique ion implantation so that the p-type body region 4 become gradually deeper. Thereafter, as illustrated in FIG. 4(*b*), the trench 7 is formed by etching with this mask 15. In this case, because the trench 7 is formed after forming the p-type body region 4, it is necessary to control the depth of the trench 7, the angle of oblique ion implantation at the forming the p-type body region 4, and other factors, such that the p-type body region 4 covers the side of the trench 7 excluding the vicinity of the bottom surface.

In the present embodiment, the trench 7 is formed so as to have a stripe shape with a given spacing as illustrated in FIG. 1. The trench 7 may have other shapes. For example, the strip can have a rounded shape at the edge, that is, the stripe may be formed so as to have a curvature. Although it is preferable to form the bottom surface of the trench 7 around the termination region 16 so as to make contact with the drift layer 2, the bottom surface of the trench 7 around the termination region 16 may be covered with the p-type body region 4 due to considerable manufacturing variations at a substrate peripheral portion of a semiconductor device. However, because the interface between the p-type body region 4 and the drift region 2 is slanted, the interface does not occupy much in the total that the ON-resistance of the semiconductor device does not greatly change. This does not result in a serious problem.

<Characteristics of Silicon-Carbide Semiconductor Device>

By using the configuration of the silicon-carbide semiconductor device of the present embodiment, the bottom surface of the trench 7 is not likely to be covered with the p-type body region 4 because the p-type body region 4 is formed by means of oblique ion implantation from the interior of the trench 7. Accordingly, the p-type body region 4 can be formed from a portion, shifted upward from the bottom of the trench 7 by a distance within ±50 nanometers relative to the thickness of the gate insulating film 8, toward the bottom of the p-type high-concentration well region 6. This can decrease the contacting area between the side of the trench 7 and the drift layer 2. Therefore, the depletion layer "c" generated along a junction between the drift layer 2 and the p-type body region 4 can relax the field intensity in the gate insulating film 8 at the bottom end of the trench 7. High withstanding voltage characteristics can be obtained at the OFF-state of the silicon-carbide semiconductor device.

Further, the p-type body region 4 is formed to have a depth which is increased as approaching in a horizontal direction from the side of the bottom of the trench 7, and the trench 7 is almost embedded into the p-type body region 4. The p-type body region 4 is not formed in the bottom-surface portion of the trench 7, but widely makes contact with the drift layer 2. A current path is ensured in the vicinity of the bottom surface of the trench 7. When the silicon-carbide semiconductor device is ON, a channel is formed on the side of the trench 7 without being interfered with by the depletion layer "c" generated along a junction between the p-type body region 4 and the drift layer 2. Therefore, the silicon-carbide semiconductor device has an improved ON-resistance.

Figure 5:
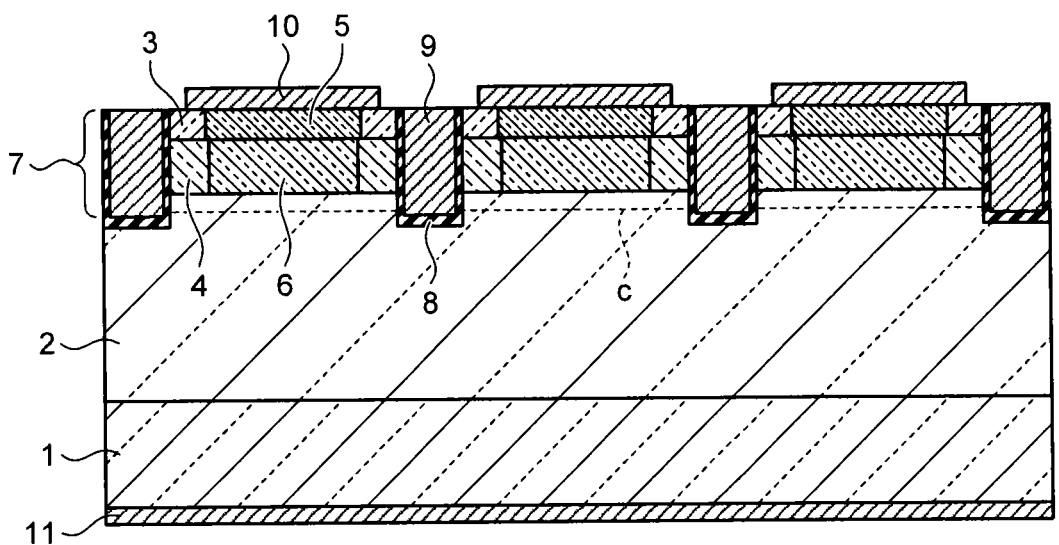
FIG. 5 is a cross-sectional view of a structure A to be compared with the first embodiment of the present invention.
Figure 6:
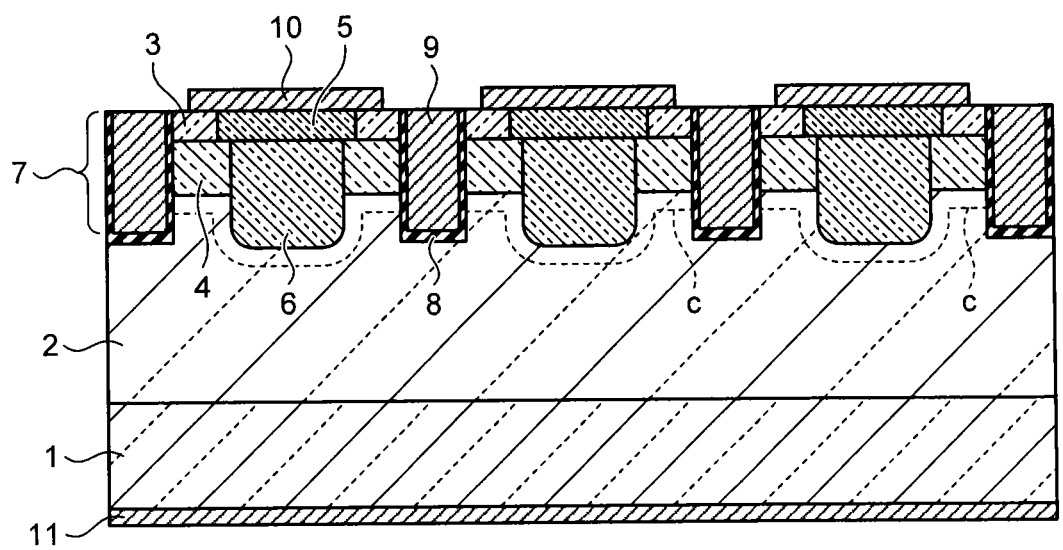
FIG. 6 is a cross-sectional view of a structure B to be compared with the first embodiment of the present invention.

The effects of relaxing the field intensity in the bottom surface of the trench 7, shown in the silicon-carbide semiconductor device of present embodiment, are compared with a silicon-carbide semiconductor device having a conventional structure. FIGS. 5 and 6 illustrate cross-sectional views of structures A and B, respectively, as comparison targets. The structure A (FIG. 5) is a silicon-carbide semiconductor device with a conventional structure, in which the p-type high-concentration well region 6 is shallower than the trench 7, and the p-type body region 4 and the p-type high-concentration well region 6 are formed with their respective bottom ends at an almost constant depth. In the structure B (FIG. 6), the p-type high-concentration well region 6 is formed so as to have a depth that is greater than that of the structure A and same as that of the trench 7, and the depth of the p-type body region 4 is almost constant from the vicinity of the trench 7 toward the p-type high-concentration well region 6. That is, the structure B is a silicon-carbide semiconductor device, in which not only the bottom surface of the trench 7, but also the sides of the bottom end of the trench 7 widely contact the drift layer 2. Furthermore, "c" denotes the position of a depletion layer. In the structures illustrated in FIGS. 5 and 6 as comparative examples, the trench end is not covered by the depletion layer "c" even though the depletion layer "c" extends.

The results of the present invention are obtained by calculation under structural conditions based on the structure-A silicon-carbide semiconductor device with a 600-volt withstanding voltage specification.

Figure 7:
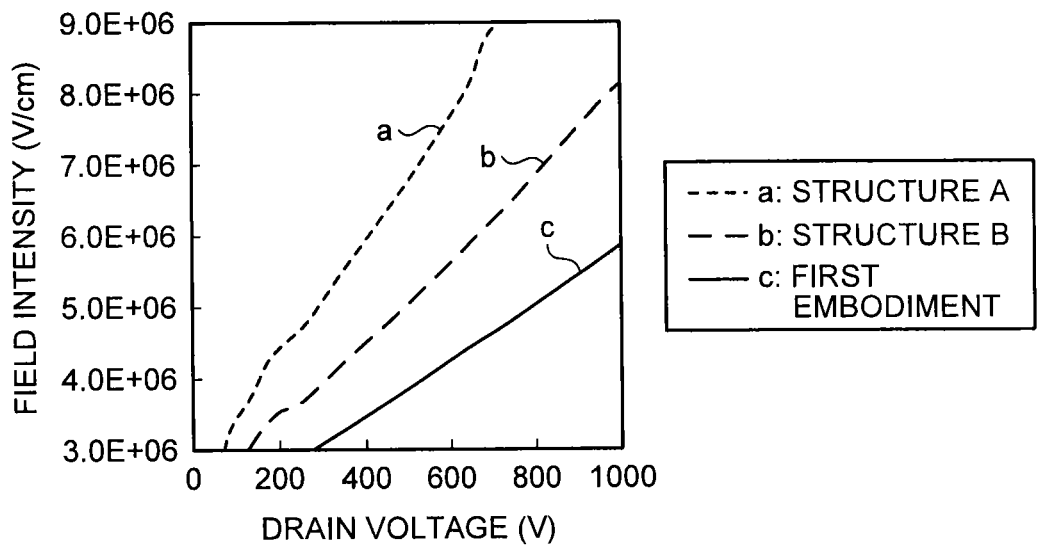
FIG. 7 illustrates field-voltage characteristics of the silicon-carbide semiconductor device according to the first embodiment of the present invention.

FIG. 7 illustrates a relationship between a drain voltage and a field intensity in the gate insulating film 8 at the bottom of the trench 7 for the silicon-carbide semiconductor devices of the present embodiment, and the structures A and B illustrated in FIGS. 5 and 6. In FIG. 7, the short dotted line "a" represents the characteristics of the structure A, the long dotted line "b" represents the characteristics of the structure B, and the straight solid line "c" represents the characteristics of the silicon-carbide semiconductor device of the present embodiment.

As illustrated in FIG. 7, the gate insulating film 8 of the structure A for a drain voltage is applied, for example, with 600 volts, and has an electric field intensity of 7.7 MV/cm, which is relatively high. In the structure B having the deeper p-type high-concentration well region 6, the field intensity is reduced to 5.6 MV/cm. In the case of the silicon-carbide semiconductor device of the present embodiment, the field intensity can be further reduced to 4.2 MV/cm, in which the p-type body region 4 is formed gradually deeper from the vicinity of the bottom of the trench 7 toward the p-type high-concentration well region 6, and thus the trench 7 is less exposed to the drift layer 2.

It is considered that this is because the p-type high-concentration well region 6 is deep enough to attract the electric field from the drain electrode 11; further the trench 7 is less exposed to the drift layer 2; and therefore, the depletion layer "c", extending from a junction between the p-type body region 4 and the drift layer 2, protects the bottom end of the trench 7 from the electric field in the drain electrode 11.

Figure 8:
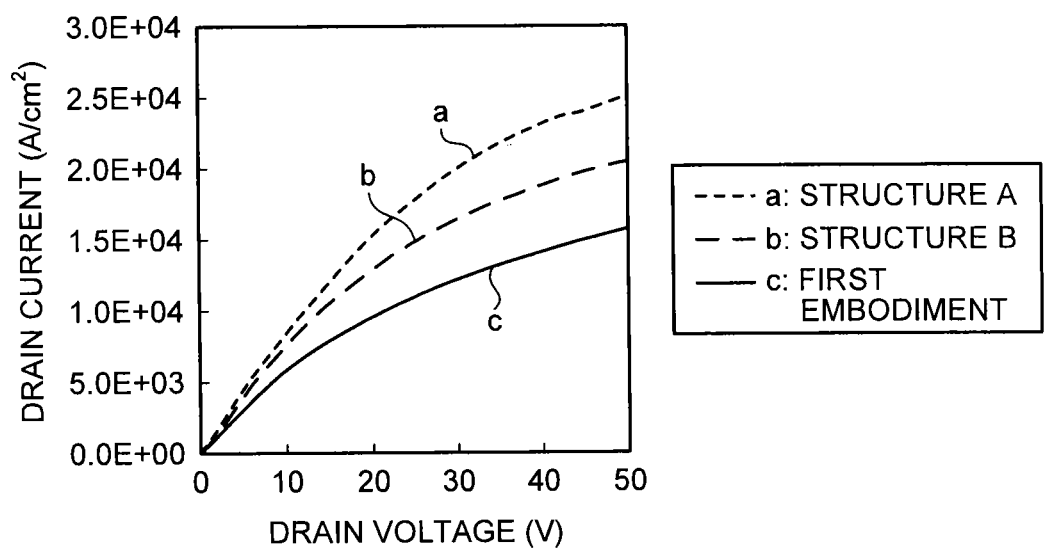
FIG. 8 illustrates ON-characteristics of the silicon-carbide semiconductor device according to the first embodiment of the present invention.

Similarly to FIG. 7, FIG. 8 illustrates a relationship between a drain current and a drain voltage in the cases of the structures A and B, and the silicon-carbide semiconductor device of the present embodiment. The gate voltage is set to be 15 volts. When ON-resistances are determined from the respective gradients, the structure A has the ON-resistance of 1.15 mΩ cm$^2$, the structure B has the ON-resistance of 1.22 mΩ cm$^2$, and the silicon-carbide semiconductor device of the present embodiment has the ON-resistance of 1.67 mΩ cm$^2$. The field intensity is greatly affected by differences in the structure of the p-type high-concentration well region 6 and other constituent elements. However, it is found from the comparison with the structures A and B that there is not a significant change in the ON-resistance of the silicon-carbide semiconductor device, even when the structure of the silicon-carbide semiconductor device is changed. Therefore, it is found that the silicon-carbide semiconductor device of the present embodiment has an ON-resistance similar in comparison with the structures A and B and that it has a significantly improved withstanding voltage.

As described above, in the structure according to the present embodiment, the p-type high-concentration well region 6 is formed so as to have a depth greater than that of the trench 7; therefore, the electric field from the drain electrode 11 is attracted by the p-type high-concentration well region 6 and also the trench 7 is less exposed to the drift layer 2. Thus, the bottom end of the trench 7 is protected from the electric field in the drain electrode 11 by the depletion layer "c", extending from a junction between the p-type body region 4 and the drift layer 2. A high withstanding voltage and a reduction in ON-resistance, thus, can be achieved. An obtuse angle is formed by the bottom surface of the trench 7 and the bottom end of the p-type body region 4 provided on both sides of the trench 7. Therefore, the depletion layer "c", extending from a junction between the p-type body region 4 and the drift layer 2, extends further to the bottom-end portion of the trench 7. Accordingly, the vicinity of the lower end of the gate electrode 9 on which electric field may concentrate can be properly protected, and consequently improvement in the withstanding voltage can be achieved.

Second Embodiment

<Structure of Silicon-Carbide Semiconductor Device>

Figure 9:
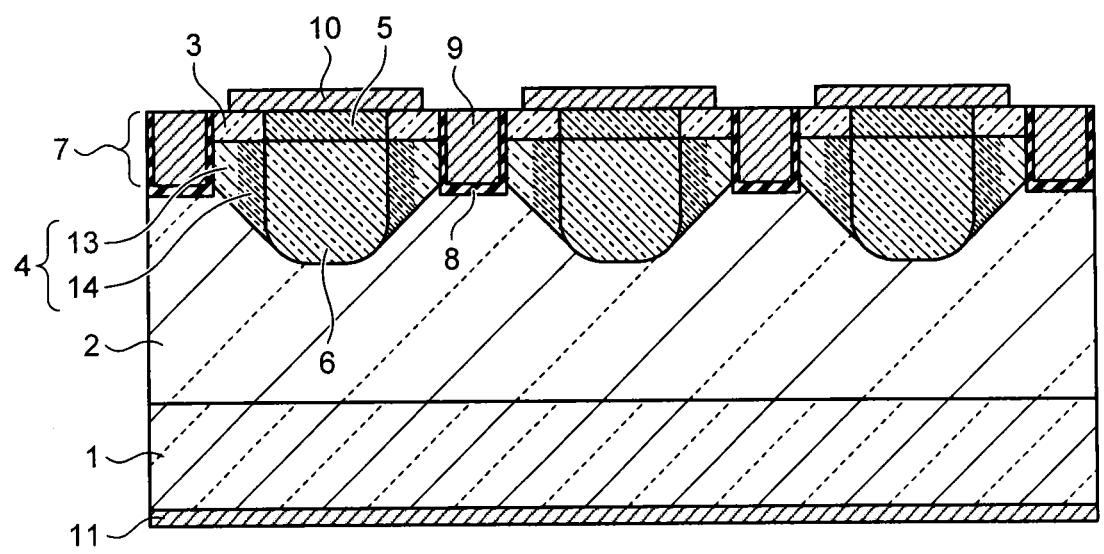
FIG. 9 is a cross-sectional view of a silicon-carbide semiconductor device according to a second embodiment of the present invention.

FIG. 9 is a cross-sectional view of a silicon-carbide semiconductor device according to a second embodiment of the present invention. The silicon-carbide semiconductor device of the second embodiment has a structure of the same basic components as the first embodiment in main elements. The silicon-carbide semiconductor device of the first embodiment has the p-type body region 4 of which ion concentrations are distributed constantly as a whole. The silicon-carbide semiconductor device of the present embodiment has the p-type body region 4 of which ion concentration amounts are distributed, which differs from the first embodiment. The silicon-carbide semiconductor device of the present embodiment has a distribution in which the ion concentration is lower in the vicinity of the trench 7 and becomes higher toward the p-type high-concentration well region 6.

<Manufacturing Method of Silicon-Carbide Semiconductor Device>

The p-type body region 4 of the present embodiment is formed by using a retrograde implantation profile when the ion is implanted obliquely, so that the p-type body region 4 can have an impurity concentration where impurity becomes higher away from the trench 7. Thus, the retrograde implantation profile is to form an impurity concentration distribution in which the impurity is low near to the surface and becomes higher far therefrom.

The silicon-carbide semiconductor device of the present embodiment is formed in accordance with the steps illustrated in FIGS. 3(a) to 3(d) in the same manner as in the first embodiment. However, at the oblique ion implantation step illustrated in FIG. 3(d), a high dose of ions is firstly implanted in a portion near the p-type high-concentration well region 6, and then a low dose of ions is implanted in a portion near the trench 7. For another example, ions are implanted multiple times from the vicinity of the trench 7 to the vicinity of the p-type high-concentration well region 6, and a higher dose of ions is implanted closer to the p-type high-concentration well region 6. With this configuration, as illustrated in FIG. 9, the impurity concentration is gradually increased from the portion near the trench 7 to the portion near the p-type high-concentration well region 6. Therefore, the p-type body region 4 can be formed so as to have a p-type low-concentration body region 13 and a p-type high-concentration body region 14.

A clear boundary may be formed between the p-type low-concentration body region 13 and the p-type high-concentration body region 14. At the boundary portion, the impurity concentration may suddenly change. A clear boundary may not be formed therebetween, and the impurity concentration may gradually change. Further, between the p-type low-concentration body region 13 and the p-type high-concentration body region 14, a plurality of successive regions having different impurity concentrations may be formed. Specifically, the p-type low-concentration body region 13 has the impurity concentration of approximately $1\times10^{16}/\text{cm}^3$ to $1\times10^{18}/\text{cm}^3$ in the vicinity of the trench 7, and the impurity concentration changes at a single stage or at multiple stages up to the vicinity of the p-type high-concentration well region 6, and can eventually reach almost the same level as in the p-type high-concentration well region 6 ($1\times10^{18}/\text{cm}^3$ in the present embodiment).

It is preferable that a difference in the impurity concentration between the p-type low-concentration body region 13 and the p-type high-concentration body region 14 within the p-type body region 4 is within a range between five times and 200 times. When the difference in the impurity concentration is below this range, this difference is so small that there is almost no effect of controlling punch-through described later. When the difference in the impurity concentration is greater than 200 times, a depletion layer between the p-type body region 4 and the drift layer 2 extends excessively, leading to an increase in the ON-resistance of the semiconductor device, and degradation of the semiconductor characteristics.

<Characteristics of Silicon-Carbide Semiconductor Device>

In the case that such a high-impurity-concentration region is formed in a portion of the p-type body region 4, a high voltage is applied on an OFF stated semiconductor device, depletion of this high-impurity-concentration region can be prevented. Therefore, the occurrence of punch-through (conduction) between the n-type source region 3 and the drift layer 2 can be suppressed. In general, for the sake of suppressing punch-through, the spacing between the p-type high-concentration well region 6 and the trench 7 is narrowed so as to suppress depletion in the p-type body region 4 and prevent punch-through. However, due to broadening of the ion-implantation direction at the ion implantation step, misalignment of the position of the mask 15 and other reasons, the spacing between the trench 7 and the p-type high-concentration well region 6 cannot be sufficiently narrowed in some cases. In this case, it is effective to form a high-impurity-concentration region partially in the p-type body region 4.

Figure 10:
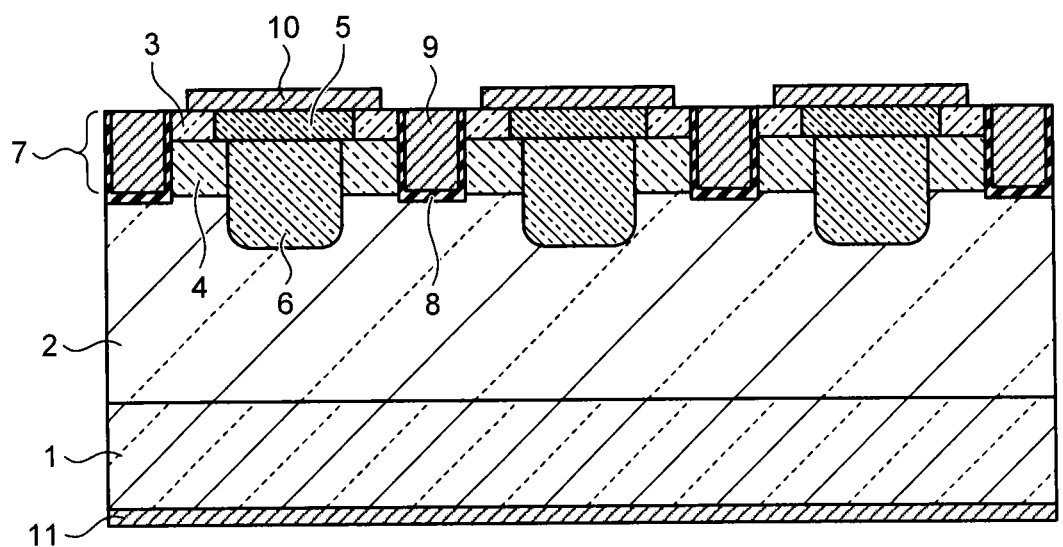
FIG. 10 is a cross-sectional view of a structure C to be compared with the second embodiment of the present invention.
Figure 11:
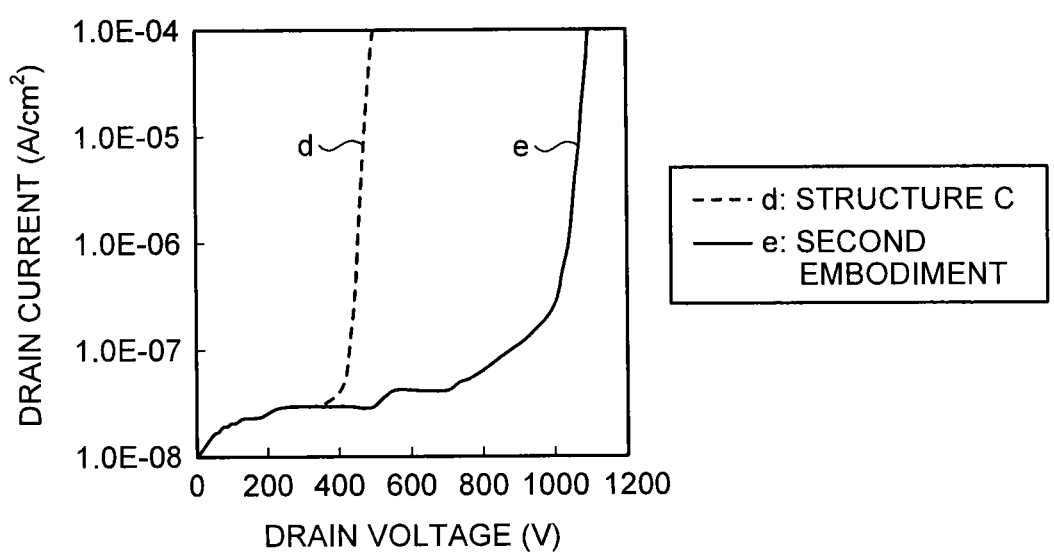
FIG. 11 illustrates OFF-characteristics of the silicon-carbide semiconductor device according to the second embodiment of the present invention.

A relationship between a drain voltage and a drain current is calculated for a silicon-carbide semiconductor device (a structure C) with its cross-sectional structure illustrated in FIG. 10, and the silicon-carbide semiconductor device (FIG. 9) of the second embodiment. FIG. 11 illustrates the results of the calculations. The structure C illustrated in FIG. 10 has the same basic configuration of that of the silicon-carbide semiconductor device of the second embodiment, but there are differences between the two. The structure C has the p-type body region 4 of uniform impurity concentration, while the second embodiment has the p-type body region 4 whose impurity concentration increases as approaching the p-type high-concentration well region 6.

In FIG. 11, a drain voltage corresponding to a sharply increased drain current represents a punch-through voltage. The structure-C silicon-carbide semiconductor device (dotted line d) shows a punch-through voltage of approximately 400 volts. The silicon-carbide semiconductor device of the second embodiment shows (solid line e) a punch-through voltage of approximately 1000 volts. The silicon-carbide semiconductor device (the second embodiment), where there is an ion-concentration distribution in the p-type body region 4 and the impurity-ion density becomes higher closer to the p-type high-concentration well region 6, shows such a higher withstanding voltage.

As described above, the p-type body region 4 of the silicon-carbide semiconductor device is produced by oblique ion implantation using a retrograde implantation profile as ion implantation. The p-type body region 4 has the high impurity concentration in the vicinity of the p-type high-concentration well region 6, and thus the occurrence of punch-through is suppressed.

In the second embodiment, the p-type body region 4 is formed to include the p-type low-concentration body region 13 and the p-type high-concentration body region 14, so as to have the impurity concentration which is higher on the side of the p-type high-concentration well region 6 than the side of the trench 7. In contrast to this, a p-type body region 4 may be formed as a grading layer whose impurity concentration gradually increases as approaching the p-type high-concentration well region 6 from the trench 7. However, the p-type body region 4 is not necessarily configured by the grading layer. The body region may be formed so as to have the impurity concentration higher on the side of the p-type high-concentration well region 6 than the side of the trench 7.

Third Embodiment

Figure 12:
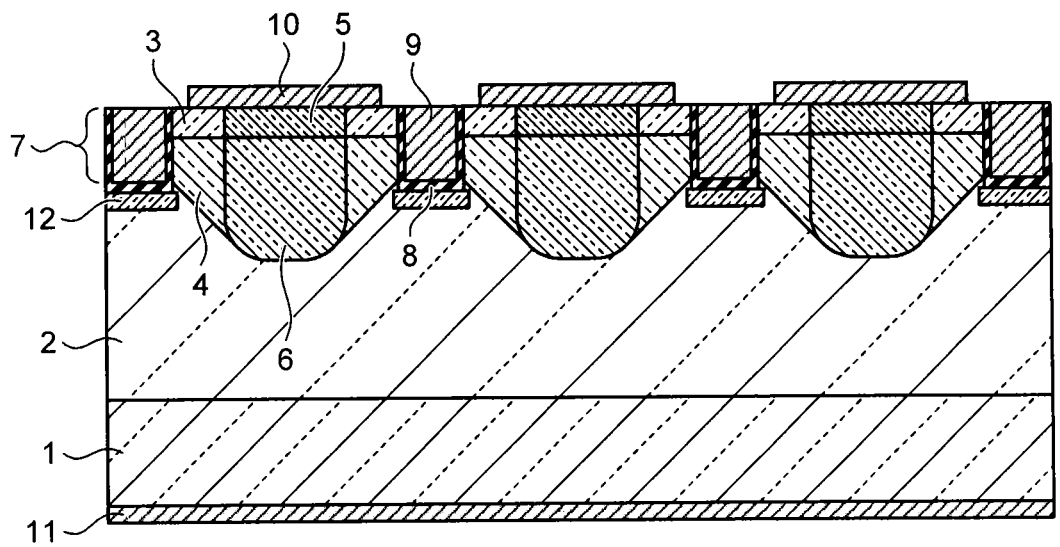
FIG. 12 is a cross-sectional view of a silicon-carbide semiconductor device according to a third embodiment of the present invention.

FIG. 12 is a cross-sectional view of a silicon-carbide semiconductor device according to a third embodiment of the present invention. In comparison with the silicon-carbide semiconductor device of the first embodiment described, the silicon-carbide semiconductor device of the present embodiment is different in that an n-type high-concentration region 12 having an impurity concentration higher than the drift layer 2 is formed adjacent to the bottom surface of the trench 7.

A manufacturing method of the silicon-carbide semiconductor device according to the present embodiment is also basically the same as that of the silicon-carbide semiconductor device of the first embodiment. However, there is a difference in the following point. After the trench 7 is formed, donor impurity ions are implanted into the interior of the trench 7 in a vertical direction to the surface thereof so as to form the n-type high-concentration region 12 adjacent to the bottom surface of the trench 7. The n-type high-concentration region 12 has an impurity concentration higher than the drift layer 2.

The n-type high-concentration region 12 is formed on the bottom surface of the trench 7, which is followed by a subsequent step. At the subsequent step, the p-type body region 4 is formed on the side of the trench 7 by oblique ion implantation. At the step, acceptor impurities may be implanted in the bottom of the trench 7 due to broadening of ion implantation or accuracy errors. However, a region in the vicinity of the bottom surface of the trench 7 is not changed into a p-type since the n-type high-concentration region 12 is already formed in the vicinity of the bottom surface of the trench 7.

The p-type body region 4 is formed on the side of the trench 7, and a depletion layer is formed between the p-type body region 4 and the drift layer 2. Therefore, the depletion layer may further extend toward the vicinity of the bottom surface of the trench 7. The extension of such a depletion layer can be limited if the n-type high-concentration region 12 is formed in the vicinity of the bottom surface of the trench 7. Accordingly, a current path can be ensured when the silicon-carbide semiconductor device is ON, and the silicon-carbide semiconductor device has the decreased ON-resistance.

The n-type high-concentration region 12 formed adjacent to the bottom surface of the trench 7 should have a donor impurity concentration that is at least twice to 10 times as high as that of the drift layer 2 located below the n-type high-concentration region 12. More preferably, the n-type high-concentration region 12 may have an impurity concentration that is five times as high as that of the drift layer 2 so that the above effects can be obtained. In a case where the difference between the impurity concentration of the n-type high-concentration region 12 and the donor impurity concentration of the drift layer 2 is twice or less, the effects are not obtained by forming the n-type high-concentration region 12 on the bottom surface of the trench 7. In a case where the difference is ten times or greater, the electric field intensity could be excessively high around the bottom surface of the trench 7.

In addition, the n-type high-concentration region 12 has a depth so as not to increase the electric field intensity in the bottom of the trench 7 and the drain electrode 11. The n-type high-concentration region 12 has a depth which is as small as possible. It is necessary for the n-type high-concentration region 12 to have a depth that is at least equal to or less than 0.5 micrometer. The n-type high-concentration region 12 has a thickness that is equal to or greater than 0.1 micrometer so as to have its own functions. In a case of the thickness of the n-type high-concentration region 12 within the range between 0.1 micrometer and 0.3 micrometer, the increase in the electric field intensity can be only small, and superior characteristics can be obtained without deteriorating the withstanding voltage characteristics.

Fourth Embodiment

Figure 13:
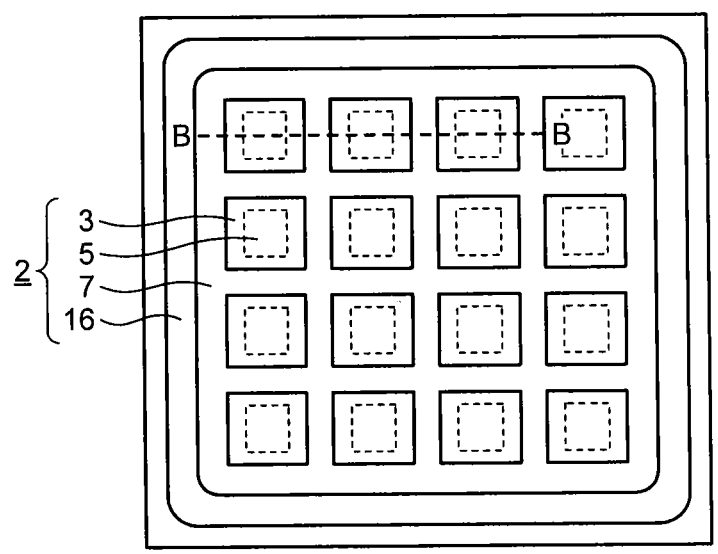
FIG. 13 is a top view of a silicon-carbide semiconductor device according to a fourth embodiment of the present invention.

FIG. 13 is a top view of a silicon-carbide semiconductor device according to a fourth embodiment of the present invention. The silicon-carbide semiconductor device of the present embodiment is different from the former embodiments in the following point. The trench 7 is arranged in a lattice shape to surround an impurity layer such as the p-type body region 4, in comparison with the trench 7 arranged in a stripe shape in the silicon-carbide semiconductor device according to the first to third embodiments.

FIG. 13 illustrates a silicon-carbide semiconductor device where the source electrode 10 is omitted from the figure for ease of viewing its surface structure. In the case of the trench 7 arranged in a lattice shape as illustrated in FIG. 13, cells are not necessarily aligned, and each cell may be polygonal or have a curvature at a corner. The n-type source region 3 and the p-type well contact region 5 are formed so as to have an island shape. At the bottom of these two regions, the p-type body region 4 and the p-type high-concentration well region 6 are formed. The trench 7 is formed in a lattice shape so as to make contact with the side of the n-type source region 3. The termination region 16 is formed around the outer periphery of the pattern. The cross section taken along a line B-B in FIG. 13 is the same as illustrated in FIG. 2 or FIG. 12.

This configuration can be formed by the following manufacturing method. FIGS. 14(a) to 14(c) illustrate manufacturing steps of the silicon-carbide semiconductor device of the present embodiment. The manufacturing steps are described herein by focusing on a manufacturing method of the p-type body region 4 that is a feature of the present embodiment. Steps excluding the above steps are the same as the manufacturing steps in the first embodiment.

First, as illustrated in FIG. 3(a) in the first embodiment, the drift layer 2 of an n-type silicon-carbide layer is formed on the n-type silicon-carbide substrate 1 using an epitaxial growth method.

Next, on the surface of the drift layer 2, a tapered mask 17 having a tapered cross section is formed using a resist. By implanting ions vertically to the device surface via this tapered mask 17, the p-type body region 4 is formed as illustrated in FIG. 14(a). At this time, a taper angle $\theta_1$ of the tapered mask 17 is equal to an angle $\theta_2$ of the inclined portion of the p-type body region 4 to be formed.

Subsequently, as illustrated in FIG. 14(b), on the surface of the drift layer 2, the n-type source region 3, the p-type well contact region 5 and the p-type high-concentration well region 6 are formed by ion implantation.

Thereafter, as illustrated in FIG. 14(c), the trench 7 is formed so as to penetrate through the p-type body region 4, a structure can be formed where the p-type body region 4 has a depth which is increased, when nearing, from the bottom of the trench 7 toward the bottom of the p-type high-concentration well region 6. The order of formation of the n-type source region 3, the p-type body region 4, the p-type well contact region 5, the p-type high-concentration well region 6, and the trench 7, which are formed by impurity ion implantation, can be interchanged.

Lastly, the gate insulating film 8 and the gate electrode 9 are formed within the trench 7. The source electrode 10 is formed so as to make contact with the n-type source region 3 and the p-type well contact region 5. The drain electrode 11 is formed on the back side. Therefore, the silicon-carbide semiconductor device having the cross section illustrated in FIG. 2 or FIG. 12, and the arrangement illustrated in the top view in FIG. 13 can be obtained.

According to the manufacturing method as described above, at the time of forming the p-type body region 4, ions can be implanted vertically to the device surface. Therefore, an impurity layer can be formed along a horizontal direction of the element in accordance with the mask-pattern arrangement and along a vertical direction of the element in accordance with the cross-sectional shape of the mask. That is, it is possible to select any planar arrangement of the element.

Figure 14:
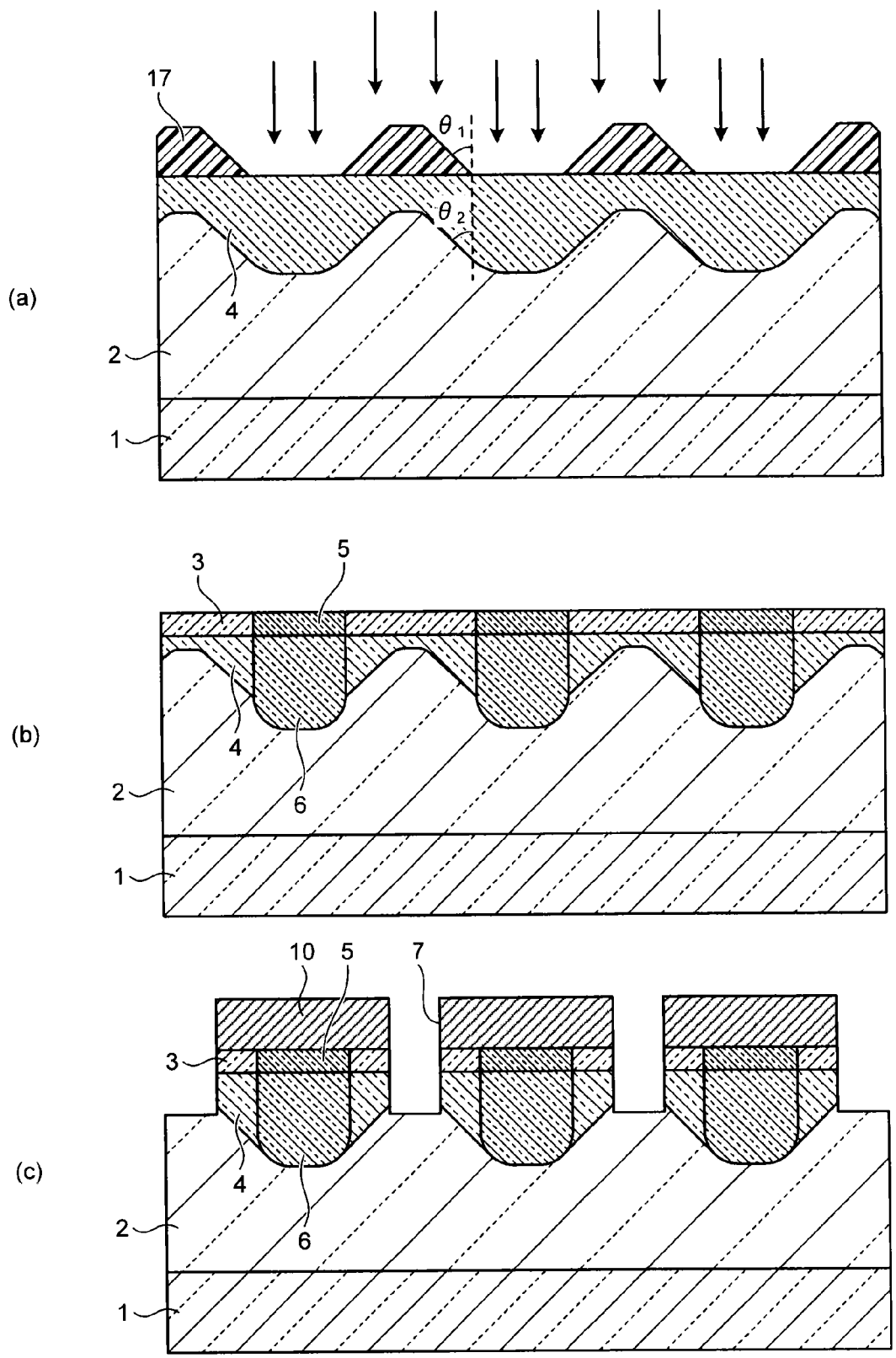
FIG. 14 are process sectional views of a manufacturing method of the silicon-carbide semiconductor device according to the fourth embodiment of the present invention.

It is noted that the tapered mask 17 as illustrated in FIG. 14 is used in both the cross sections in a horizontal direction of the element and a vertical direction of the element, that is, in the X direction and the Y direction, the p-type body region 4 can be formed so as to have a tapered cross section in four directions.

The first to fourth embodiments are described as examples of the silicon-carbide substrate having the n-type conductivity. A p-type silicon-carbide substrate may also be employed. Either the n-type or p-type silicon-carbide substrate may be appropriately selected.

The step of forming the trench is achieved by dry etching, but the present invention is not limited to dry etching and the dry etching may be performed along with the wet etching.

REFERENCE SIGNS LIST 1 n-type silicon-carbide substrate, 2 drift layer, 3 n-type source region, 4 p-type body region, 5 p-type well contact region, 6 p-type high-concentration well region, 7 trench, 8 gate insulating film, 9 gate electrode, 10 source electrode, 11 drain electrode, 12 n-type high-concentration region, 13 p-type low-concentration body region, 14 p-type high-concentration body region, 15 mask, 16 termination region, 17 tapered mask.

The invention claimed is:

1. A manufacturing method of a silicon-carbide semiconductor device, the method comprising:
a step of forming a drift layer made of silicon carbide of a first conductivity-type on a silicon-carbide semiconductor substrate of a first conductivity-type by an epitaxial growth method;
a step of forming a trench on a surface of the drift layer;
a step of forming a high-concentration well region of a second conductivity-type with a predetermined spacing from the trench by ion implantation so that the high-concentration well region has a depth larger than that of the trench;
a step of embedding the trench with an embedding material;
a step of forming a body region of the second conductivity-type by performing oblique ion implantation through the trench embedded with the embedded material to form the body region of the second conductivity-type such that the body region has a depth that increases as the bottom end of the high-concentration well region of the second conductivity-type is approached from a position upward from the bottom of the trench;
a step of removing the embedded material after having formed the body region;
a step of forming a gate insulating film on an inner wall surface of the trench; and
a step of forming a gate electrode within the gate insulating film.

2. The manufacturing method of a silicon-carbide semiconductor device according to claim 1, wherein
the body region forming step is a step of forming a body region in which an impurity concentration is higher on a side of the high-concentration well region than on a side of the trench.

3. The manufacturing method of a silicon-carbide semiconductor device according to claim 2, wherein
the step of forming the body region is a step of forming a body region that includes a grading layer in which the impurity concentration gradually increases as the high-concentration well region is approached.

4. The manufacturing method of a silicon-carbide semiconductor device according to claim 1, wherein
the step of forming the body region is a step of forming a body region such that a bottom of the body region that makes contact with the side of the trench is positioned upward from a bottom of the trench by a distance within ±50 nanometers relative to a thickness of the gate insulating film at the bottom of the trench.

5. The manufacturing method of a silicon-carbide semiconductor device according to claim 1, wherein
the silicon-carbide semiconductor substrate of the first conductivity-type is a silicon-carbide semiconductor substrate an n-type, and
the step of forming the body region is a step of forming a body region of p-type of which acceptor concentration is $1\times10^{16}/cm^3$ to $1\times10^{18}/cm^3$.

6. The manufacturing method of a silicon-carbide semiconductor device according to claim 1, wherein:
the step of removing the embedded material comprises dissolving the embedded material.

7. A manufacturing method of a silicon-carbide semiconductor device, the method comprising:
a step of forming a drift layer made of silicon carbide of a first conductivity-type on a silicon-carbide semiconductor substrate of a first conductivity-type by an epitaxial growth method;
a step of forming a trench on a surface of the drift layer;
a step of forming a high-concentration well region of a second conductivity-type with a predetermined spacing from the trench by ion implantation so that the high-concentration well region has a depth larger than that of the trench;
a step of forming a body region of a second conductivity-type by oblique ion implantation through the trench so that the body region has a depth which increases, when nearing, from a position upward from a bottom of the trench toward a bottom end of the high-concentration well region of the second conductivity-type;
a step of forming a high-concentration layer of a first conductivity-type, of which impurity concentration is higher than that of the drift layer, in a region making contact with a bottom of the trench in the drift layer;
a step of forming a gate insulating film on an inner wall surface of the trench; and
a step of forming a gate electrode within the gate insulating film.

8. The manufacturing method of a silicon-carbide semiconductor device according to claim 7, wherein
the step of forming the body region is a step of forming a body region such that a bottom of the body region that makes contact with the side of the trench is positioned upward from a bottom of the trench by a distance within ±50 nanometers relative to a thickness of the gate insulating film at the bottom of the trench.

9. The manufacturing method of a silicon-carbide semiconductor device according to claim 7, wherein
the silicon-carbide semiconductor substrate of the first conductivity-type is a silicon-carbide semiconductor substrate an n-type, and
the step of forming the body region is a step of forming a body region of p-type of which acceptor concentration is $1\times10^{16}/cm^3$ to $1\times10^{18}/cm^3$.

10. A silicon-carbide semiconductor device comprising:
a silicon-carbide semiconductor substrate of a first conductivity-type;
a drift layer formed on a first surface of the silicon-carbide semiconductor substrate, the drift layer being made of silicon carbide of a first conductivity-type of which concentration is lower than that of the silicon-carbide semiconductor substrate;
a trench that is formed in the drift layer;
a gate insulating film that is formed on an inner wall surface of the trench;
a gate electrode that is formed within the gate insulating film;
a high-concentration well region formed with a predetermined spacing from the trench, the high-concentration well region being formed so as to have a depth larger than that of the trench and being made of silicon carbide of a second conductivity-type;
a body region, made of silicon carbide of the second conductivity-type, that
is formed from an end of the gate electrode at a bottom side of the trench and surrounds the trench, and
is formed such that a depth of the body region increases as a bottom of the high-concentration well region is approached; and
a source region
formed in an upper-layer portion of the body region,
formed of silicon carbide of a first conductivity-type of which concentration is higher than that of the drift layer, and formed so as to make contact with a side of the trench; wherein a high-concentration layer of a first conductivity-type, of which impurity concentration is higher than that of the drift layer, is formed in a region of the drift layer, the region making contact with the bottom surface of the trench.

11. The silicon-carbide semiconductor device according to claim 10, wherein
a thickness of the high-concentration layer of the first conductivity-type is 0.1 micrometer to 0.3 micrometer.

12. The silicon-carbide semiconductor device according to claim 10, wherein
the high-concentration layer of the first conductivity-type has an impurity concentration twice to 10 times as high as that of the drift layer.

* * * * *